United States Patent [19]

Miyagi

[11] Patent Number: 5,415,585
[45] Date of Patent: May 16, 1995

[54] DECOMPRESSION APPARATUS
[75] Inventor: Katsusin Miyagi, Sagamihara, Japan
[73] Assignees: Tokyo Electron Limited, Tokyo; Tokyo Electron Tohoku Limited, Essashi, both of Japan
[21] Appl. No.: 197,873
[22] Filed: Feb. 17, 1994
[30] Foreign Application Priority Data
Feb. 17, 1993 [JP] Japan .................................. 5-055194
[51] Int. Cl.$^6$ .............................. F27D 5/00; F27B 9/00
[52] U.S. Cl. ........................................ 454/187; 422/2; 422/152; 422/241
[58] Field of Search ...................... 422/10; 432/2, 6, 5, 432/152, 241; 454/187

[56] References Cited
U.S. PATENT DOCUMENTS
4,856,987 8/1989 Yasuda et al. .................. 432/241 X
5,273,423 12/1993 Shiraiwa ................................ 32/241

FOREIGN PATENT DOCUMENTS
2-273921 11/1990 Japan .

Primary Examiner—Harold Joyce
Attorney, Agent, or Firm—Oblon, Spivak, McClelland, Maier & Neustadt

[57] ABSTRACT

A decompression apparatus comprises an exhaust line connected to a processing unit, an exhaust device connected to the exhaust line, whereby the processing unit is exhausted through the exhaust line, and an ambience in the processing unit can be set under a negative pressure, a main valve in the exhaust line for opening and closing the exhaust line, a bypass line having one end portion, connected to that portion of the exhaust line which is situated nearer to the processing unit than the main valve, and the other end portion connected to that portion of the exhaust line which is situated on the exhaust side of the main valve, the exhaust flow quantity of the bypass line per unit time being lower than that of the exhaust line, a sub-valve in the bypass line for opening and closing the bypass line, and a control unit adapted to close the main valve and the sub-valve as the pressure in the processing unit is increased from the negative pressure to the normal pressure and to open only the sub-valve to keep the exhaust side of the processing unit under the negative pressure after the pressure in the processing unit is restored to the normal pressure.

18 Claims, 3 Drawing Sheets

DECOMPRESSION APPARATUS

BACKGROUND OF THE INVENTION

1. Field of the Invention

The present invention relates to a decompression apparatus provided with an exhaust mechanism for decompression, and more particularly, to a decompression apparatus, such as a CVD apparatus, used in a manufacturing process for semiconductor devices.

2. Description of the Related Art

Conventional decompression apparatuses furnished with an exhaust mechanism for decompression include, for example, a processing apparatus used in a thermal diffusion process and filming process for semiconductor devices. This processing apparatus executes processes such as a filming process for an object of processing, e.g., a semiconductor wafer, in a processing unit in a manner such that the internal pressure of the processing unit is reduced to a vacuum pressure by the exhaust mechanism. If the interior the processing unit is set in a vacuum in this manner, impurities, such as oxygen and water in the atmosphere, can be prevented from adhering to the object of processing. In order to get a vacuum in the processing unit, the exhaust side of the processing unit is connected to a vacuum pump by means of an exhaust line. The exhaust line is fitted with a trap device which traps impurities and products from the processing unit by condensing them.

Figure 3:
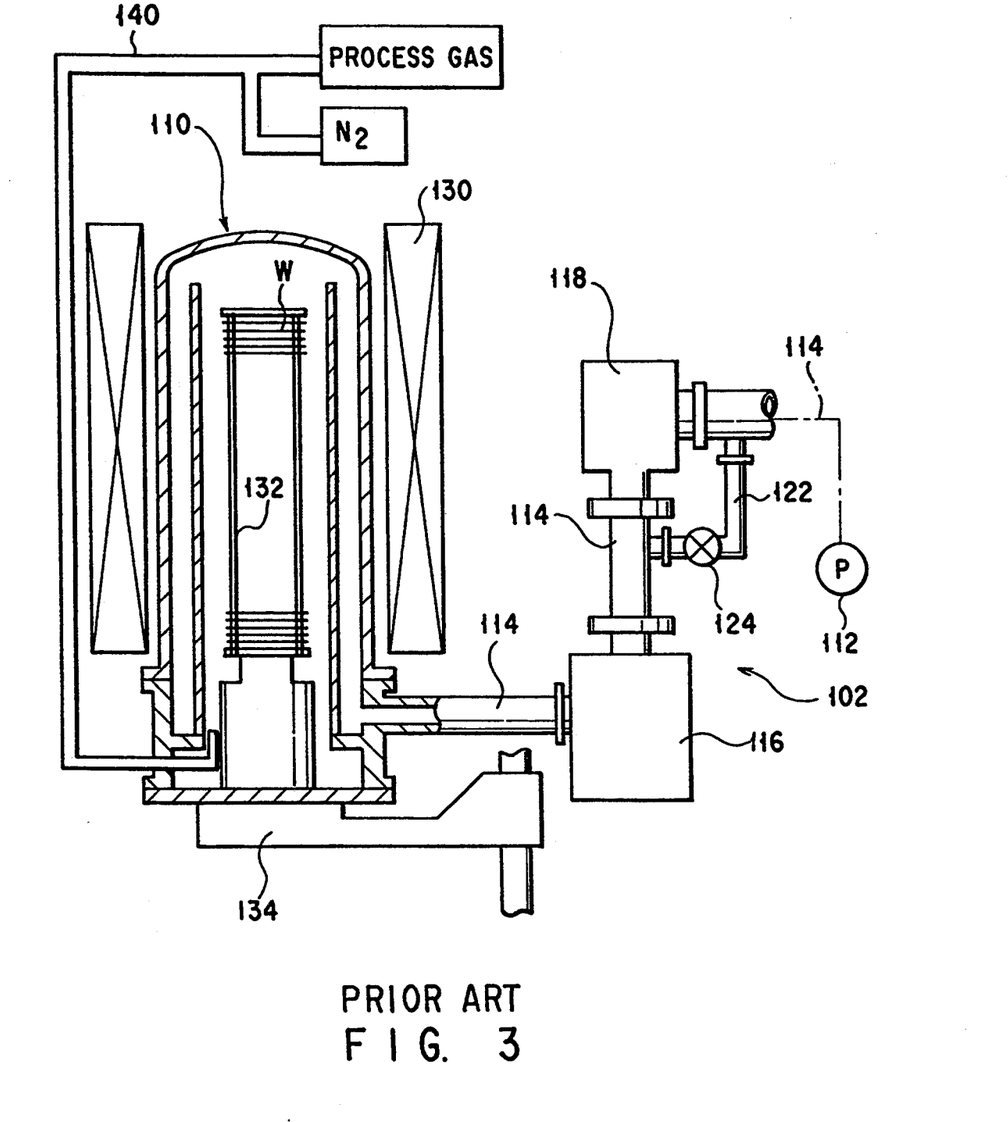
FIG. 3 is a schematic view showing the principal part of a CVD apparatus as a prior art decompression apparatus.

FIG. 3 shows the construction of a processing unit and an exhaust system of a CVD apparatus as an example of the decompression apparatus. This CVD apparatus is an apparatus for forming a thin film on the surface of a semiconductor wafer W by chemical vapor deposition in a semiconductor device manufacturing process. In FIG. 3, numeral 110 denotes the processing unit for a filming process in which the thin film is formed on the surface of the semiconductor wafer W as an object of processing, and numeral 102 denotes the exhaust system for setting the interior of the processing unit 110 in a vacuum. A heater 130 is arranged around the unit 110. A wafer boat 132, which carries thereon a plurality of semiconductor wafers W arranged at regular intervals, is delivered into or from the processing unit 110 by means of a boat elevator 134. The exhaust system 102 comprises an exhaust pump 112 and an exhaust line 114 which connects the pump 112 to an exhaust port of the unit 110. The line 114 is fitted with a trap device 116 and a main valve 118 which are arranged successively along the exhaust direction from the side of the unit 110. When the valve 118 is opened and the exhaust pump 112 is actuated, in this arrangement, the processing unit 110 is exhausted to be evacuated, and impurities and a product from the unit 110 are trapped by means of the trap device 116.

When the main valve 118 is opened in an instant when the processing unit 110 is exhausted, the pressure in the unit 110 is reduced suddenly, so that the semiconductor wafers W in the unit 110 may possibly move, or particles may be flung up in the unit 110. To avoid this, therefore, a bypass line 122 for detouring the main valve 118 is provided in the middle of the exhaust line 114. In the initial stage of exhaust operation, slow exhaust is effected such that gas is discharged gradually or little by little from the processing unit 110 through the line 122. In order to carry out this slow exhaust, the bypass line 122 is fitted with a sub-valve 124 for opening and closing it, and the line 122 is formed having a flow area narrower than that of the exhaust line 114, for example. Thus, if the sub-valve 124 is opened earlier than the main valve 118 so that the processing unit 110 is exhausted gradually through the bypass line 122, in the initial stage of the exhaust operation, the pressure in the unit 110 can be prevented from being reduced suddenly.

The sub-valve 124, which serves to prevent a transient change of pressure in the processing unit 110 in the initial stage of the exhaust operation, is closed when the movement of the semiconductor wafers W and the flinging of the particles cease with the progress of the exhaust operation. Thereafter, the main valve 118 is opened, and main exhaust from the processing unit 110 is effected through the exhaust line 114. Alternatively, the main exhaust from the unit 110 may be effected through both the bypass line 122 and the exhaust line 114 with the line 122 kept open without closing the sub-valve 124.

The main valve 118 is open during the execution of the processes, such as the filming process in the processing unit 110, and so is the sub-valve 124 in some cases. During the processing operation, the product and gas are discharged from the unit 110 into the trap device 116, and are condensed thereby. In order to prevent the product from adhering to the valve itself, in this case, the main valve 118 is provided with heating means for heating it, for example.

The main valve 118 and sub-valve 124 are closed when the semiconductor wafers W are delivered into or from the processing unit 110. In other words, the unit 110 is opened to allow the processed wafers W to be delivered therefrom after the valve 118 and sub-valve 124 are closed so that the internal pressure of the unit 110 is increased from the vacuum pressure to the normal pressure. Also, the semiconductor wafers w are delivered into the processing unit 110 in the normal-pressure state with the main valve 118 and sub-valve 124 closed. In order to increase the internal pressure of the unit 110 from the vacuum pressure to the normal pressure, a process gas introduced into the unit 110 through a process gas inlet pipe 140 is first exhausted. When this exhaust operation is finished, the main valve 118 is closed (and so is the sub-valve 124 if open), and a purge gas, such as nitrogen gas, is introduced into the unit 110.

Increasing the internal pressure of the processing unit 110 from the vacuum pressure to the normal pressure, however, involves the following problems. The trap device 116 and the unit 110 communicate with each other at all times. If the internal pressure of the processing unit 110 is increased from the vacuum pressure to the normal pressure, therefore, a substance adhering to the trap device 116 easily evaporates, diffuses from the device 116 into the exhaust line 114, and flows backward into the unit 110. In a filming process using silicon nitride as the process gas, in particular, ammonium chloride gas is formed as a product. Since the ammonium chloride gas absorbs water, it can evaporate relatively easily, and its evaporation increases as the normal pressure is approached. Accordingly, the ammonium chloride gas, caused to adhere to the trap device 116 during the exhaust operation, is liable to flow backward from the device 116 to the processing unit 110 as the pressure is switched to the normal pressure. This backward flow is also produced in silicon dioxide which is formed in a filming process using TEOS. In some cases, the gas fed back from the trap device 110 into the processing unit 110 in this manner adheres to the semiconductor wafers W delivered into or from the unit 110, thereby soiling the wafers.

In the case where the process gas used forms a product which contains noxious substances, such as phosphorus (BPSG), arsenic, etc., these substances are trapped in the trap device 116. If the processing unit 110 is opened during the delivery of the semiconductor wafers W, therefore, the harmful substances may possibly leak out from the unit 110. If the returned product remains in the unit 110, moreover, setting the interior of the unit 110 under a predetermined vacuum pressure takes a long time in the next cycle of exhaust operation. Accordingly, the standby time before the start of the next filming process is too long to ensure a satisfactory throughput in the semiconductor wafer manufacturing process.

SUMMARY OF THE INVENTION

The object of the present invention is to provide a decompression apparatus in which impurities and harmful substances once discharged are prevented from flowing backward into a processing unit, and the interior of the processing unit can be set under a predetermined pressure in a short period of time.

In above object of the present invention is achieved by a decompression apparatus constructed as follows. The decompression apparatus comprises: a processing unit for processing an object of processing; an exhaust line connected to the processing unit; exhaust means connected to the exhaust line, whereby the processing unit is exhausted through the exhaust line, and an ambience in the processing unit can be set under a negative pressure; a main valve in the exhaust line for opening and closing the exhaust line; a bypass line having one end portion, connected to that portion of the exhaust line which is situated nearer to the processing unit than the main valve, and the other end portion connected to that portion of the exhaust line which is situated on the exhaust side of the main valve, the exhaust flow quantity of the bypass line per unit time being lower than that of the exhaust line; a sub-valve in the bypass line for opening and closing the bypass line; and control means adapted to close the main valve and the sub-valve as the pressure in the processing unit is increased from the negative pressure to the normal pressure and to open only the sub-valve to keep the exhaust side of the processing unit under the negative pressure after the pressure in the processing unit is restored to the normal pressure.

In the case where trap means for trapping an exhaust from the processing unit discharged through the exhaust line is provided in the middle of the exhaust line so as to be situated between the main valve and the processing unit, in particular, the apparatus is preferably provided with exhaust conductance means provided in the middle of the exhaust line so as to be situated nearer to the processing unit than the trap means and adapted to be throttled after the pressure in the processing unit is restored from the negative pressure to the normal pressure, purge gas supply means for feeding a purge gas into that portion of the exhaust line which is situated nearer to the processing unit than the trap means, and exhaust pressure control means capable of freely adjusting the pressure of exhaust through the exhaust line.

According to the present invention, the exhaust side of the processing unit is kept under the negative pressure, so that the backward flow into the processing unit can be prevented. The sub-valve in the bypass line, along with the main valve, is closed as the decompressed processing unit is restored to the normal pressure, and is opened after the normal pressure is restored. Under the normal pressure, therefore, the interior of the processing unit and the exhaust means communicate with each other by means of the sub-valve, whereby the exhaust side of the processing unit is kept under the negative pressure. In the case where the trap means is located behind the processing unit, in particular, its internal pressure is negative, so that a product and impurities trapped in the trap means are prevented from flowing backward into the processing unit.

According to the present invention, moreover, exhaust conductance means capable of throttling the exhaust line is provided between the processing unit and the trap means. The conductance means throttles the exhaust line after the pressure in the decompressed processing unit is restored to the normal pressure. Although the displacement through the bypass line is small, therefore, the negative-pressure state in the trap means is effectively enhanced by use of the conductance means.

According to the present invention, furthermore, purge gas supply means for feeding the purge gas is provided between the exhaust conductance means and the trap means. The product or gas in the trap means can be prevented from flowing backward by purging the trap means by means of the purge gas from the purge gas supply means.

DETAILED DESCRIPTION OF THE PREFERRED EMBODIMENT

An embodiment of the present invention will now be described in detail with reference to the accompanying drawings.

Figure 1:
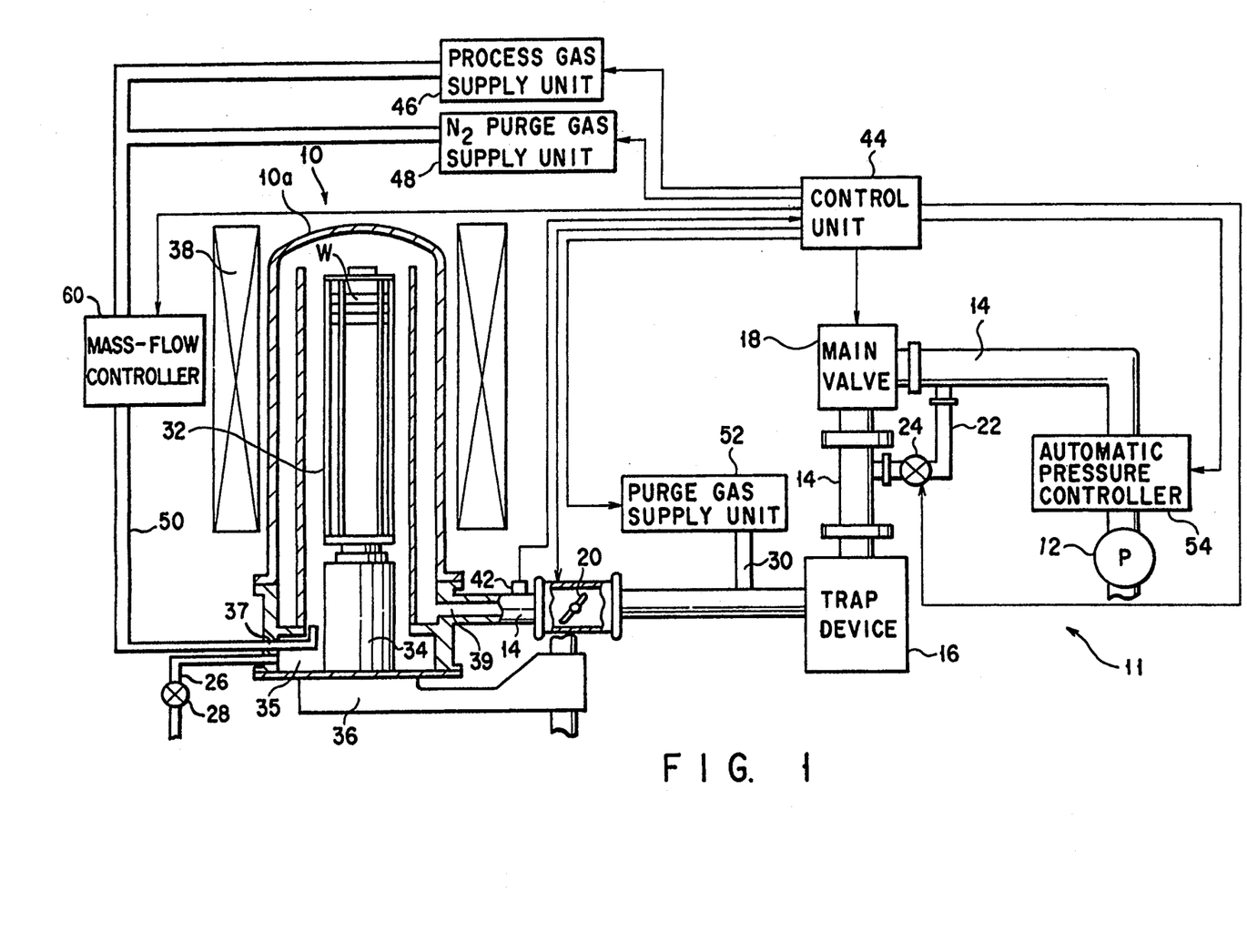
FIG. 1 is a schematic view showing the principal part of a vertical CVD apparatus according to an embodiment of a decompression apparatus of the present invention.

FIG. 1 shows the principal part of a vertical CVD apparatus according to an embodiment of a decompression apparatus of the present invention. In FIG. 1, numeral 10 denotes a processing unit for forming a thin film on the surface of a semiconductor wafer w as an object of processing. Numeral 11 denotes an exhaust system for setting the interior of a reaction tube 10a of the processing unit 10 in a vacuum. The processing unit 10 includes the reaction tube 10a, in the form of a substantially vertical cylinder, and a cylindrical heater 38 surrounding the tube 10a. The exhaust system 11 includes a vacuum pump 12 and a first exhaust line 14 which connects the pump 12 to an exhaust port 39 of the tube 10a. The line 14 is fitted with a trap device 16 and a main valve 18 which are arranged successively along the exhaust direction from the side of the processing unit 10. The trap device 16 has a structure, such as the one described in Jpn. Pat. Appln. KOKAI Publication No. 2-59002, in which impurities and a product discharged from the reaction tube 10a are condensed and trapped. Preferably, the device 16 has a cold-trap structure such that the impurities and product can be condensed efficiently.

A process gas supply unit 46 for supplying a specified process gas and an $N_2$ purge gas supply unit 48 for supplying nitrogen gas as a purge gas are connected to a gas inlet port 37, which is located at the bottom of the reaction tube 10a, by means of a gas inlet pipe 50. A mass-flow controller 60 is arranged at the gas inlet pipe 50, and an amount of the gas supplied from the gas supply units 46, 48 through the gas inlet pipe 50 can be determined by controlling an opened degree of a control valve provided in the mass-flow controller on the basis of a control signal from a control unit 44. Formed at the bottom of the tube 10a is an opening 35 through which a wafer boat 32, carrying thereon a plurality of semiconductor wafers W arranged vertically at regular intervals, can be delivered into the tube 10a. A boat elevator 36 for vertically moving the boat 32 underlies the reaction tube 10a. An insulating cylinder 34, which is located on the elevator 36, supports the boat 32 from below. In this arrangement, the wafer boat 32, carrying the semiconductor wafers W thereon, is delivered into or from the reaction tube 10a through the opening 35 of the tube 10a as the boat elevator 36 moves up or down.

In filming the semiconductor wafers W in the reaction tube 10a, the interior of the tube 10a is first previously heated to a predetermined temperature, e.g., about 700 to 1,000° C., by means of the heater 38, and the boat elevator 36 is then raised to deliver the wafer boat 32, carrying the wafers W thereon, into the tube 10a. Subsequently, the process gas supply unit 46 is actuated to introduce the specified process gas into the reaction tube 10a through the gas inlet pipe 50. Thereupon, the gas is circulated through the tube 10a, whereby a thin film is formed on the surface of each semiconductor wafer w by chemical vapor deposition. In executing this filming process, the wafer boat 32, carrying the semiconductor wafers W thereon, is first delivered into the reaction tube 10a through the opening 35 with an ambience in the tube 10a under the normal pressure as the boat elevator 36 moves in the vertical direction. Thereafter, the vacuum pump 12 is actuated to exhaust the reaction tube 10a through the exhaust system 11. By this exhaust operation, the ambience in the tube 10a is set in a vacuum. In this vacuum state, a series of processes including the filming process is executed, whereupon the reacted gas in the tube 10a is discharged through the first exhaust line 14 by the pump 12. Also, the exhaust gas containing the unaffected process gas having failed to react in the tube 10a flows into the line 14. This exhaust gas is trapped and removed by the trap device 16. The processed semiconductor wafers W are delivered from the reaction tube 10a after the ambience pressure in the tube 10a is increased from the vacuum pressure to the normal pressure. The following is a detailed description of the construction of the exhaust system 11 which performs this exhaust operation.

A bypass line 22 for detouring the main valve 18 is provided in the middle of the first exhaust line 114 which constitutes the exhaust system 11. Thus, both end portions of the bypass line 22 are connected to the line 14 on either side of the valve 18. In the initial stage of exhaust operation before the filming process, slow exhaust is effected such that gas is discharged gradually or little by little from the reaction tube 10a through the line 22 (see FIG. 2). In order to carry out this slow exhaust, the bypass line 22 is fitted with a sub-valve 24 for opening and closing it, and the line 22 is formed having a flow area narrower than that of the first exhaust line 14, for example. Thus, if the sub-valve 24 is opened earlier than the main valve 18 so that the reaction tube 10a is exhausted gradually through the bypass line 22, in the initial stage of the exhaust operation, the pressure in the tube 10a can be prevented from being reduced suddenly.

The sub-valve 24, which serves to prevent a transient change of pressure in the reaction tube 10a in the initial stage of the exhaust operation, is closed when the movement of the semiconductor wafers W and flinging of particles cease with the progress of the exhaust operation. Thereafter, the main valve 18 is opened, and main exhaust from the reaction tube 10a may be effected through the first exhaust line 14. According to the present embodiment, however, the main exhaust from the tube 10a is effected through both the bypass line 22 and the first exhaust line 14 with the line 22 kept open without closing the sub-valve 24, as shown in FIG. 2.

The first exhaust line 14, which is situated on the upper-course side of the trap device 16 with respect to the exhaust direction, is provided with a butterfly valve 20 which constitutes one of features of the present invention. The valve 20 serves as exhaust conductance means which opens and closes the first exhaust line 14, thereby enhancing the negative-pressure state on the side of the trap device 16. Normally, therefore, the butterfly valve 20 is closed after the internal pressure of the decompressed reaction tube 10a is restored to the normal pressure. Functionally, the valve 20 does not require an accuracy such that it can close up the first exhaust line 14 tight, and it is necessary only that a gap be formed between the valve 20 and the inner surface of the line 14 such that the negative pressure on the trap side can be increased when the valve 20 is closed. Further, the butterfly valve 20 is provided with heating means (not shown), whereby the product can be prevented from adhering to the valve 20.

A purge gas supply unit 52 is connected, by means of a purge gas supply line 30, to that portion of the first exhaust line 14 which is situated between the butterfly valve 20 and the trap device 16. In order to prevent the gas from the device 16 from flowing backward when the reaction tube 10a is opened to allow the atmosphere to enter the exhaust line 14 during the delivery of the semiconductor wafers W, the purge gas, such as nitrogen gas, is fed from the supply unit 52 into the first exhaust line 14 through the supply line 30, once the valve 20 is closed. Thus, when the reaction tube 10a is opened, the atmosphere gets into the trap device 16 through the line 14. Accordingly, the product trapped in the device 16 evaporates and diffuses into the reaction tube 10a. Thereupon, the gas from the evaporated product is forced back toward the trap device 16 by causing the purge gas to break into a passage for the diffusion of the product gas.

Figure 2:
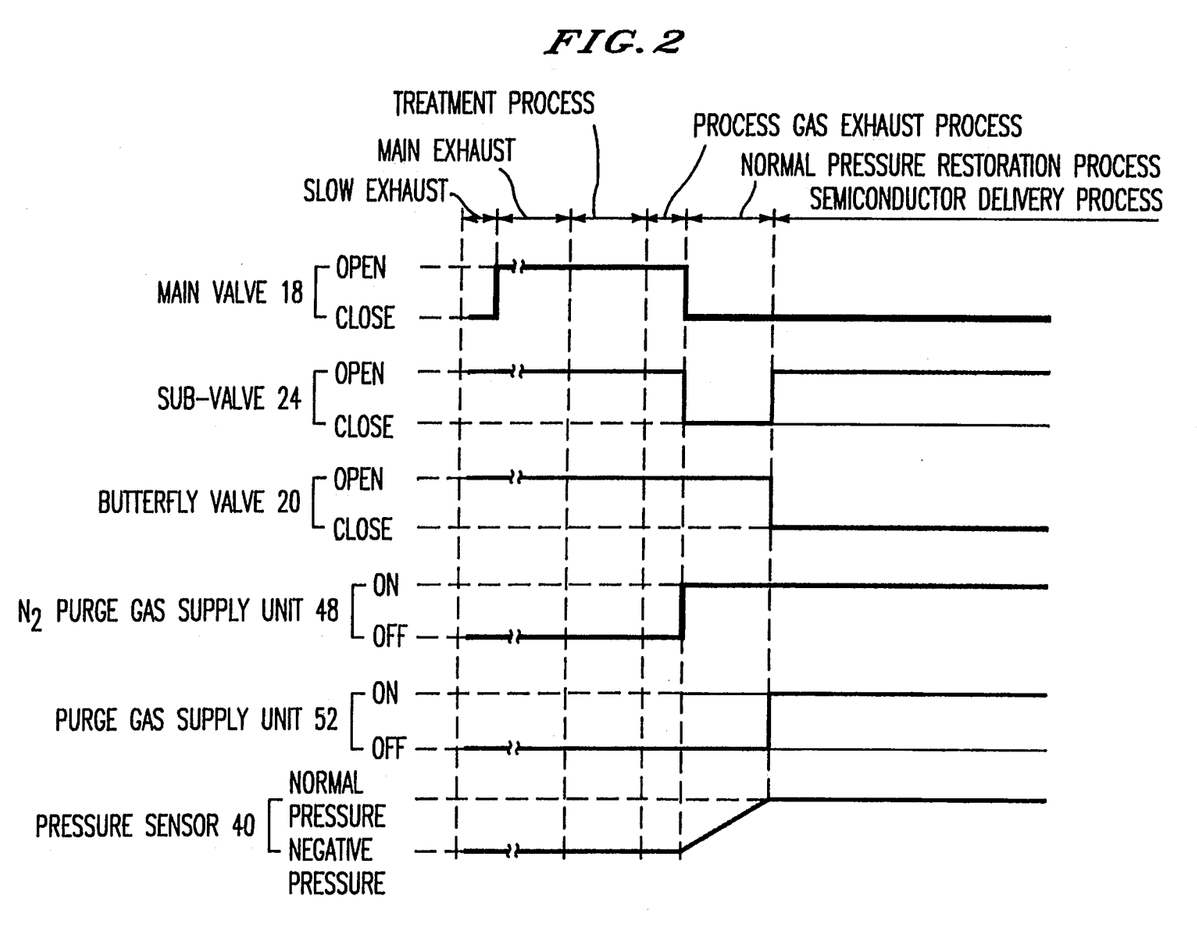
FIG. 2 is a timing chart illustrating the timing for the operations of various valves in the vertical CVD apparatus shown in FIG. 1.

The main valve 18, sub-valve 24, and butterfly valve 20 are open while the processing is being executed in the reaction tube 10a (see FIG. 2). Thus, during the processing, the product or gas is continually discharged from the reaction tube 10a, and is introduced into the trap device 16 to be condensed thereby. In order to prevent the product from adhering to the main valve 18 itself, in this case, the valve 18 is provided with heating means for heating it, for example.

The main valve 18 and the butterfly valve 20 are closed when the semiconductor wafers w are delivered into or from the reaction tube 10a. In other words, the sub-valve 24 and the butterfly valve 20 are opened and closed, respectively, after the valve 18 is closed so that the internal pressure of the tube 10a is increased from the vaccum pressure to the normal pressure. Thereafter, the processed wafers W are delivered from the reaction tube 10a. Also, the semiconductor wafers W are delivered into the tube 10a in the normal-pressure state with the main valve 18 and the butterfly valve 20 closed (and with the sub-valve 24 open). In order to increase the internal pressure of the reaction tube 10a from the vacuum pressure to the normal pressure, the process gas introduced into the tube 10a through the gas inlet pipe 50 is first exhausted. When this exhaust operation is finished, the main valve 18 is closed, and the purge gas, such as nitrogen gas, is introduced from the $N_2$ purge gas supply unit 48 into the reaction tube 10a through the inlet pipe 50.

A second exhaust line 26 is also connected to the reaction tube 10a. The line 26 is fitted with a valve 28 which opens when a predetermined level is reached by the internal pressure of the tube 10a. Thus, the internal pressure of the tube 10a can be kept below the predetermined level even though the pressurizing purge gas is introduced into the tube 10a.

Another feature of the present invention lies in the valve timing for each of the aforementioned valves, especially in that the operations of the valves and the gas supply units are controlled so as to prevent the gas from the trap device 16 from flowing backward after the normal pressure is restored. FIG. 2 shows a timing chart illustrating the operations of the valves and gas supply units. All the operations of the valves and the gas supply units are controlled by means of a control unit 44. In other words, in executing a series of processes including the filming process in the reaction tube 10a, the main valve 18, sub-valve 24, and butterfly valve 20 are opened. Thus, the interior of the tube 10a is evacuated by means of the vacuum pump 12, so that the product from the tube 10a is trapped in the trap device 16. Therefore, the sub-valve 24 is closed together with the main valve 18 as the internal pressure of the decompressed reaction tube 10a is restored to the normal pressure by means of the purge gas, and is opened after the normal pressure is restored.

When the processes in the reaction tube 10a are finished, the process gas is exhausted. This exhaust operation is accomplished as nitrogen gas is fed from the $N_2$ purge gas supply unit 48 into the tube 10a. The main valve 18 and the sub-valve 24 are kept open during this process gas exhaust operation. When exhausting the process gas is finished, the valves 18 and 24 are closed. During the exhaust operation, the internal pressure of the reaction tube 10a is gradually increased to the normal pressure by means of the purge gas. At a stage at which the internal pressure in the reaction tube 10a becomes the normal pressure, the sub-valve 24 and the butterfly valve 20 are opened and closed, respectively, in response to control signals from the control unit 44. As a result, the trap device 16 communicates with the vacuum pump 12 by means of the bypass line 22, so that its tendency toward the negative pressure is maintained. This tendency toward the negative pressure is promoted by throttling the exhaust line 14 by means of the butterfly valve 20. In doing this, the purge gas is introduced into the line 14 through the supply line 30. Even if the atmosphere flows toward the trap device 16 when the reaction tube 10a is opened, therefore, the product from the device 16 is prevented from flowing backward in front of the device 16.

The quantity of the product trapped in the trap device 16, that is, trapping efficiency, varies depending on the flow resistance (internal pressure) of the exhaust line 14. If the pressure in the trap device 16 is lower, then the trapping efficiency is lowered in proportion. In the present embodiment, therefore, an automatic pressure controller 54 is located on the lower-course side of the main valve 18 with respect to the exhaust direction. The controller 54 serves to control the pressure in the exhaust line 14. More specifically, a pressure sensor 42 is provided on the upper-course side of the trap device 16 (upper-course side of the butterfly valve 20 in FIG. 1) with respect to the exhaust direction. The control unit 44 controls the opening of a valve mechanism of the controller 54 in accordance with the internal pressure of the exhaust line 14 detected by means of the sensor 42. Thus, the internal pressure of the line 14 can be adjusted according to various processing conditions, even though the set pressure for the processing varies.

According to the CVD apparatus of the present embodiment, as described above, the exhaust side of the reaction tube 10a is kept under the negative pressure in the normal-pressure state, in which the semiconductor wafers W are delivered into or from the tube 10a, by reopening the sub-valve 24, having been closed in the process for the restoration of the normal pressure, after the normal pressure is restored. By doing this, the substance condensed by the trap device 16 can be prevented from flowing backward from the device 16 to the side of the reaction tube 10a. Thus, the semiconductor wafers W can be securely prevented with ease from being soiled by the product or impurities. This preventive effect against the backward flow is enhanced by the butterfly valve 20, which is located nearer to the reaction tube 10a than the trap device 16 and leaves a narrow gap when closed, and the purge gas from the purge gas from the purge gas supply unit 52. More specifically, the product urged to flow back from the device 16 toward the reaction tube 10a is intercepted by the butterfly valve 20 and purge gas fed into that portion of the exhaust line 14 between the valve 20 and the device 16. The prevention of the backward flow from the trap device 16 toward the reaction tube 10a is particularly profitable in the case where the device 16 is located in the vicinity of the tube 10a.

Since the backward flow from the trap device 16 toward the reaction tube 10a is prevented in this manner, moreover, no product remains in the tube 10a. Accordingly, setting the interior of the tube 10a under a predetermined vacuum pressure in the next cycle of exhaust operation requires a shorter time than in the conventional case.

Since the automatic pressure controller 54 ensures the exhaust state for the satisfactory trapping efficiency, most of the product can be trapped in the trap device 16, so that the exhaust line 14 can avoid being soiled inside by the product. Also, the backward flow preventive effect is enhanced by this arrangement.

Although the CVD apparatus has been described herein as an example of the decompression apparatus in connection with the present embodiment, the present invention is not limited to this apparatus, and may be also applied to any other decompression apparatuses which comprise an exhaust mechanism for decompression. For example, the invention may be applied to a plasma processing apparatus with a structure which carries out processing in a vacuum ambience, thereby trapping products. Moreover, the location of the trap device 16 is not limited to a position near the reaction tube 10a. For example, the trap device may be located on the exhaust side of the main valve 18.

What is claimed is:

1. A decompression apparatus comprising:
   a processing unit for processing an object of processing therein;
   an exhaust line connected to the processing unit;
   exhaust means connected to the exhaust line, whereby the processing unit is exhausted through the exhaust line, and an ambience in the processing unit can be set under a negative pressure;
   a main valve in the exhaust line for opening and closing the exhaust line;
   a bypass line having one end portion, connected to that portion of the exhaust line which is situated nearer to the processing unit than the main valve, and the other end portion connected to that portion of the exhaust line which is situated on the exhaust side of the main valve, the exhaust flow quantity of the bypass line per unit time being lower than that of the exhaust line;
   a sub-valve in the bypass line for opening and closing the bypass line; and
   control means adapted to close the main valve and the sub-valve as the pressure in the processing unit is increased from the negative pressure to the normal pressure and to open only the sub-valve to keep the exhaust side of the processing unit under the negative pressure after the pressure in the processing unit is restored to the normal pressure.

2. A decompression apparatus according to claim 1, further comprising exhaust conductance means provided in the middle of the exhaust line so as to be situated nearer to the processing unit than the main valve and adapted to be throttled after the pressure in the processing unit is restored from the negative pressure to the normal pressure.

3. A decompression apparatus according to claim 2, wherein said exhaust conductance means is a butterfly valve.

4. A decompression apparatus according to claim 2, further comprising purge gas supply means for feeding a purge gas into that portion of the exhaust line between the exhaust conductance means and the sub-valve.

5. A decompression apparatus according to claim 4, wherein said purge gas supply means is actuated to feed the purge gas after the pressure in the processing unit is restored from the negative pressure to the normal pressure.

6. A decompression apparatus comprising:
   a processing unit for processing an object of processing therein;
   an exhaust line connected to the processing unit;
   exhaust means connected to the exhaust line, whereby the processing unit is exhausted through the exhaust line, and an ambience in the processing unit can be set under a negative pressure;
   a main valve in the exhaust line for opening and closing the exhaust line;
   a bypass line having one end portion, connected to that portion of the exhaust line which is situated nearer to the processing unit than the main valve, and the other end portion connected to that portion of the exhaust line which is situated on the exhaust side of the main valve, the exhaust flow quantity of the bypass line per unit time being lower than that of the exhaust line;
   a sub-valve in the bypass line for opening and closing the bypass line;
   trap means provided in the middle of the exhaust line so as to be situated between the main valve and the processing unit, whereby an exhaust from the processing unit discharged through the exhaust line is trapped; and
   control means adapted to close the main valve and the sub-valve as the pressure in the processing unit is increased from the negative pressure to the normal pressure and to open only the sub-valve to keep the exhaust side of the processing unit under the negative pressure after the pressure in the processing unit is restored to the normal pressure.

7. A decompression apparatus according to claim 6, further comprising exhaust conductance means provided in the middle of the exhaust line so as to be situated nearer to the processing unit than the trap means and adapted to be throttled after the pressure in the processing unit is restored from the negative pressure to the normal pressure.

8. A decompression apparatus according to claim 7, wherein said exhaust conductance means is a butterfly valve.

9. A decompression apparatus according to claim 6, further comprising purge gas supply means for feeding a purge gas into that portion of the exhaust line which is situated nearer to the processing unit than the trap means.

10. A decompression apparatus according to claim 9, wherein said purge gas supply means is actuated to feed the purge gas after the pressure in the processing unit is restored from the negative pressure to the normal pressure.

11. A decompression apparatus according to claim 7, further comprising purge gas supply means for feeding a purge gas into that portion of the exhaust line between the exhaust conductance means and the trap means.

12. A decompression apparatus according to claim 11, wherein said purge gas supply means is actuated to feed the purge gas after the pressure in the processing unit is restored from the negative pressure to the normal pressure.

13. A decompression apparatus according to claim 6, further comprising exhaust pressure control means capable of freely adjusting the pressure of exhaust through the exhaust line.

14. A decompression apparatus according to claim 13, wherein said exhaust pressure control means includes a pressure sensor for detecting the pressure in that portion of the exhaust line near the processing unit, a valve mechanism provided in the middle of the exhaust line so that the valve opening of the valve mechanism is freely adjustable, and a control section for controlling the valve opening of the valve mechanism in response to a pressure signal from the pressure sensor.

15. A decompression apparatus according to claim 11, further comprising exhaust pressure control means capable of freely adjusting the pressure of exhaust through the exhaust line.

16. A decompression method comprising:
   a first process for delivering an object of processing into a processing unit under the normal pressure;
   a second process for exhausting the processing unit with the object of processing therein and setting an ambience in the processing unit under a negative pressure;

a third process for processing the object of processing in the processing unit while exhausting the processing unit so that the ambience therein is kept under the negative pressure;

a fourth process for stopping the exhaust of the processing unit after processing the object of processing is finished and increasing the pressure in the processing unit from the negative pressure to the normal pressure; and a fifth process for exhausting the processing unit so that the exhaust side of the processing unit is kept under the negative pressure after the normal pressure is reached by the pressure in the processing unit.

17. A decompression method according to claim 16, wherein an exhaust from the processing unit is trapped in said second and third process, and an exhaust-side passage of said processing unit is throttled to trap the exhaust in said fifth process.

18. A decompression method according to claim 17, wherein a purge gas is fed to the exhaust side of the processing unit in said fifth process.

* * * * *

UNITED STATES PATENT AND TRADEMARK OFFICE
CERTIFICATE OF CORRECTION

PATENT NO. : 5,415,585
DATED : May 16, 1995
INVENTOR(S) : Katsusin MIYAGI

It is certified that error appears in the above-indentified patent and that said Letters Patent is hereby corrected as shown below:

On the title page, Item [73], the city of the second Assignee should read:

--Esashi--

Signed and Sealed this

Eighteenth Day of July, 1995

Attest:

BRUCE LEHMAN

*Attesting Officer*     *Commissioner of Patents and Trademarks*